(12) United States Patent
Lee et al.

(10) Patent No.: US 6,857,090 B2
(45) Date of Patent: Feb. 15, 2005

(54) SYSTEM AND METHOD FOR AUTOMATICALLY ANALYZING AND MANAGING LOSS FACTORS IN TEST PROCESS OF SEMICONDUCTOR INTEGRATED CIRCUIT DEVICES

(75) Inventors: Kyu Sung Lee, Cheonan (KR); Ae Yong Chung, Cheonan (KR); Sung Ok Kim, Cheonan (KR)

(73) Assignee: Samsung Electronics Co., Ltd., Suwon (KR)

( * ) Notice: Subject to any disclaimer, the term of this patent is extended or adjusted under 35 U.S.C. 154(b) by 592 days.

(21) Appl. No.: 09/971,934

(22) Filed: Oct. 9, 2001

(65) Prior Publication Data
US 2003/0005376 A1 Jan. 2, 2003

(30) Foreign Application Priority Data
May 14, 2001 (KR) ........................................ 2001-26070

(51) Int. Cl.⁷ .......................... G01R 31/28; H03K 19/03
(52) U.S. Cl. ........................... 714/724; 714/741; 714/33
(58) Field of Search ............................... 714/31, 32, 33, 714/35, 37, 38, 39, 57, 55, 46, 48, 49, 703, 738, 724, 741; 700/223; 702/122, 108, 117, 118

(56) References Cited

U.S. PATENT DOCUMENTS

| | | |
|---|---|---|
| 5,400,263 A | 3/1995 | Rohrbaugh et al. |
| 5,581,491 A | 12/1996 | Biwer et al. |
| 5,589,765 A | 12/1996 | Ohmart et al. |
| 5,828,985 A | 10/1998 | Sauer et al. |
| 5,951,704 A | 9/1999 | Sauer et al. |
| 6,055,463 A | 4/2000 | Cheong et al. |
| 6,057,679 A | 5/2000 | Slizynski et al. |
| 6,078,189 A | * 6/2000 | Noel ........................... 324/765 |
| 6,467,056 B1 | * 10/2002 | Satou et al. ................. 714/720 |
| 2003/0018456 A1 | * 1/2003 | Browne et al. ................ 703/2 |

FOREIGN PATENT DOCUMENTS

| | | |
|---|---|---|
| KR | 1999-1946 | 1/1999 |
| KR | 1999-68947 | 9/1999 |
| KR | 1002699420000 | 7/2000 |

* cited by examiner

Primary Examiner—Christine T. Tu
(74) Attorney, Agent, or Firm—Volentine Francos, PLLC

(57) ABSTRACT

A system and method automatically analyzes and manages loss factor data of test processes in which a great number of IC devices are tested as a lot with a number of testers. The lot contains a predetermined number of identical IC devices, and the lot test process is performed sequentially according to a predetermined number of test cycles. The system include a means for verifying test results for each of the test cycles and for determining whether or not a re-test is to be performed and an IC device loading/unloading means for loading IC devices to be tested and contained in the lot to a test head and for unloading the tested IC devices from the test head by sorting the tested IC devices according to the test results. The system also includes raw data generating means for generating raw data on the basis of time data occurring when the test process is performed; data calculating means for calculating testing time data, index time data based on the raw data, and loss time data; data storage means for storing the raw data and the calculated data; and data analyzing and outputting means for analyzing the raw data and the calculated data according to the lots, the plurality of testers and the IC device loading/unloading means and for outputting the analyzed output through an user interface. The test system includes testers, a server system and terminal computer, and the server system is provided with data storage means for integrally manipulating time data generated by the testers according to lots and test cycles and for storing manipulated time data.

41 Claims, 9 Drawing Sheets

FIG. 5

| | |
|---|---|
| Loading Time Data | Starting Handler Operation - Start of First Test Cycle |
| Calibration Time Data | ∑ [(Average Test Time of Cycles × C1) - Average Test Time of Specific One Cycle] |
| Jamming Time Data | ∑ [C2 ≤ Index Time < C3] |
| Failure Time Data | ∑ [Index Time ≧ C3] |
| Re-Test Time Data | Termination of Cycle - Start of Re-Test |
| Unloading Time Data | Termination of Final Cycle - Lot End Time |
| Exchanging Time Data | Termination of Previous Lot - Start of New Lot Test |
| Socket-off Time Data | Converted Time Value of Loss Resulted When Test Socket Failed |
| Test Time Data for Each Cycle | Summation of CPU Operation Time for Each Test Cycle |
| Index Time Data | (n+1)-th Cycle Start Time - n-th Cycle Termination Time |

Fig. 9

| Product Name | Tester Model | Head Model | STEP | para | Test Time | Index Time | TOTAL | 계단T |
|---|---|---|---|---|---|---|---|---|
| J105RB-TC1AT00-6R | TS365 | MR5508 | 070001 | 16 | 35.0 | 2.0 | 37.0 | 2.3 |
| 53238M-QC00000-7A( | TS581B | M6741A | 070001 | 16 | 128.5 | 7.4 | 135.9 | 8.5 |
| | | | 090001 | 16 | 219.5 | 4.8 | 224.3 | 14.0 |
| 23237A-QC00000-7B( | TS581B | M6741A | 090RJI | 16 | 131.0 | 4.5 | 135.5 | 8.5 |
| 23237A-QC00000-7B( | TS581D | M6741A | 070001 | 16 | 69.0 | 6.0 | 75.0 | 4.7 |
| | | | 090001 | 16 | 96.7 | 2.7 | 98.3 | 8.1 |
| 23238B-QC00000-7A( | TS581D | M6741A | 070001 | 16 | 277.8 | 3.3 | 287.0 | 17.9 |
| 23229JA-QC00000-7D( | TS581D | M6741A | 070001 | 16 | 75.5 | 8.0 | 83.5 | 5.2 |
| | | | 090001 | 16 | 117.5 | 5.0 | 122.5 | 7.7 |
| 63222A-PC00000-60S | TS581D | M6711A | 090001 | 16 | 89.6 | 6.4 | 96.0 | 6.0 |
| 80838B-TCA2000-8YS | TS585 | M6541AD | 090VF/ | 64 | 24.0 | 3.6 | 27.6 | 0.4 |
| 80838C-TC80000-7X( | TS581D | MR5300 | 090001 | 64 | 1,306.0 | 12.0 | 1318.0 | 20.6 |
| | TS585 | M6541A | 070001 | 64 | 391.3 | 4.0 | 395.3 | 6.2 |
| | | | 090001 | 64 | 1,299.0 | 6.0 | 1299.0 | 20.3 |
| 10638B-TCA0000-8XS | TS581D | M6842D | 090001 | 64 | 19.0 | 41.0 | 60.0 | 0.9 |
| 10638D-TCA0000-8XS | TS581D | M6842D | 090001 | 64 | 67.8 | 21.8 | 89.7 | 1.4 |
| 60438B-TC00000-8XS | TS581D | MR5300 | 090BN- | 64 | 2,059.0 | 13.0 | 2072.0 | 32.4 |
| | | S7210 | 090BN- | 64 | 2,058.0 | 11.0 | 2069.0 | 32.3 |
| | TS585 | M6541A | 090BN- | 64 | 2,054.0 | 5.0 | 2059.0 | 32.2 |
| 60438B-TC00000-8XS | TS581D | MR5300 | 070001 | 64 | 528.0 | 6.6 | 634.6 | 8.4 |
| 60438B-TCS0000-8XS | TS581D | MR5300 | 090001 | 64 | 4,792.0 | 13.0 | 4805.0 | 75.1 |
| | TS585 | M6541A | 090001 | 64 | 4,781.0 | 3.0 | 4784.0 | 74.8 |

SYSTEM AND METHOD FOR AUTOMATICALLY ANALYZING AND MANAGING LOSS FACTORS IN TEST PROCESS OF SEMICONDUCTOR INTEGRATED CIRCUIT DEVICES

BACKGROUND

1. Field of the Invention

This invention relates to a technology for testing semiconductor integrated circuit (IC) devices, and more particularly to a system and a method for automatically analyzing and managing loss factors in the test process.

2. Description of Related Art

After manufacture and prior to shipment, semiconductor IC devices are typically subjected to a number of tests to verify their performance and reliability. Among these is an electrical performance test.

The electrical performance test may include a DC test, an AC test and a functional test. The DC test is to verify DC characteristics of an IC device by performing an open/short test, measuring input currents, output voltages, power supply currents, etc. The AC test measures timings of an IC device by applying input pulse signals to input terminals of the device to check operational characteristics such as input/output propagation delay time (or access time), starting and finalized time of input and output signals, etc. In the functional test, test patterns generated from a pattern generator are transformed into pulse signals having a normal level and applied to a Device Under Test (DUT). The output signals from the DUT are compared to reference signals, for instance in the case of memory devices, to verify read/write functions and mutual interference of each of the memory cells during actual operation. Generally, a dynamic functional test combining the AC and functional tests is performed.

Conventional test systems for the electrical performance sort the IC devices into a number of "bin" categories according to the test results. For example, the semiconductor devices classified as "BIN 1" (i.e., bin category 1) are those that pass, or fall within the electrical performance specification, for all test items.

The test process constitutes a significant portion of the manufacture of semiconductor IC devices in terms of both time and expense. For testing mass-produced IC devices, expensive test systems and highly efficient handler systems are necessary. As the electrical performance of IC devices increasingly improves, the expense and time in the testing process grows higher and longer. As a result, loss factors found in the test process significantly affect the yield and productivity of IC devices more than expected before. The test process is commonly performed by lots in which a great number, e.g., one thousand (1,000) of IC devices are contained. The loss factors that may be caused in the lot test include time losses such as actual operation of the test system, loading, unloading, indexing, instantaneous stoppage, failure repair, lot change and re-testing.

However, in the conventional test process, the loss factor data are collected manually by operators or organized solely based on the practical experiences of test engineers. Accordingly, the loss factor data varies depending on the operators or engineers and therefore are not reliable. Furthermore, there exist loss factors that cannot be traced manually or empirically, which makes impossible the analytical collection and management of data concerning the loss factors. As the need of time-to-market of small-numbered and various kinds of semiconductor IC devices becomes more pressing, the improvement in the yield and productivity of IC devices increases in importance. Therefore, it would be highly desirable to reduce the loss factors and optimize the operational efficiency of test systems.

Moreover, it is necessary to efficiently and integrally control the test process performed by a tremendously large number of testers.

SUMMARY OF THE INVENTION

It is an object of this invention to automatically analyze and manage loss factors occurring in a test process.

Another object of this invention is to quickly deal with losses in a test process and to improve the efficiency of operation of a test system.

Further, it is also an object of this invention to precisely, analytically and quickly collect various time data occurring in the test process.

In one aspect, the present invention is a system for automatically analyzing and managing loss factors occurring in test processes in which a great number of IC devices are tested lot by lot with a number of testers. The lot contains a predetermined number of identical IC devices, and the test process for the lot is performed sequentially according to a predetermined number of test cycles. The system comprises a means for verifying test results for each of the test cycles and for determining if a re-test is to be performed or not; IC device loading/unloading means for loading IC devices to be tested and contained in the lot to a test head and for unloading the tested IC devices from the test head by sorting the tested IC devices according to the test results; raw data generating means for generating raw data on the basis of time data occurring when the test process is performed; data calculating means for calculating testing time data, index time data based on the raw data, and loss time data; data storage means for storing the raw data and the calculated data; and data analyzing and outputting means for analyzing the raw data and the calculated data according to the lots, the plurality of testers and the IC device loading/unloading means and for outputting the analyzed output through an user interface.

In another aspect, the present invention is a system comprising: test systems each including a plurality of testers operated by a dedicated test program and IC devices loading/unloading means for loading IC devices to be tested into the tester and for unloading and sorting the tested IC devices depending on test results; a server system including data storage means for integrally manipulating time data generated by the test systems according to the plurality of lots and test cycles and for storing the manipulated time data; terminal systems electrically interconnected to the server system and communicating with operators with an user interface; and the testers and/or server system comprising raw data generation means for generating raw data based on the time data occurring during the test process and data calculating means for calculating test time data, index time data and loss time data based on the raw data.

In a further aspect, the present invention is a method for automatically analyzing and managing loss factors occurring in a test process in which IC devices are tested lot by lot with a number of testers, each lot containing a predetermined number of identical IC devices, and the test process for each lot being performed sequentially according to a plurality of test cycles, said method comprising steps of:

generating raw data for each of the plurality of test cycles and in real-time according to the progress of the test process; generating test time data and index time data for each test cycle based on the generated raw data; calculating loss time data based on the raw data, test time data and index time data; generating and storing test process data based on data obtained from the step of calculating loss time data; and analyzing the test process data and outputting the analyzed result to an user interface.

These and other features, and advantages, will be more clearly understood from the following detailed description taken in conjunction with the accompanying drawings. It is important to point out that the illustrations may not necessarily be drawn to scale, and that there may be other embodiments of this invention that are not specifically illustrated but which will still fall under the scope of the present invention.

BRIEF DESCRIPTION OF THE INVENTION

FIG. 5 illustrates a time data extracting method.

FIG. 9 shows still another exemplary user interface suitable for use in analyzing and managing loss factors in a test process of semiconductor integrated circuit devices.

DETAILED DESCRIPTION OF PREFERRED EMBODIMENTS

Semiconductor IC devices are tested physically and/or electrically at numerous intervals during the overall fabrication process. However, the more critical tests of semiconductor devices are conducted during the latter portions of the fabrication and assembly processes. These test processes are commonly referred to as quality assurance (QA) tests and final testing of the devices. For ICs, these QA and final tests typically occur after the wafer fabrication and assembly processes, or when the IC chip is fully assembled or otherwise considered complete. The description herein mainly outlines the final testing performed after the IC devices' wafer fabrication and assembly processes are completed. However, those who have ordinary skill in the pertinent art could easily understand that the present invention can be applied to various test processes and is not limited to final testing.

Typically, during a final test process, the static and dynamic electrical performance characteristics of each assembled semiconductor device are tested to ensure that the device meets stringent design requirements and customer specifications. Those devices that pass these final tests are then theoretically ready to be packaged and shipped to customers. Semiconductor manufacturers that use existing final test processes typically test the assembled or completed semiconductor devices by lot (about 1,000 devices/lot). Each device in the lot is passed through an automated or semi-automated test system, which contains equipment that measures the device's AC, DC and parametric or dynamic electric performance characteristics. The test equipment compares each device's performance characteristics with established design criteria and/or customer requirements, and sorts the devices according to the results. Generally, the devices are sorted according to their having passed or failed the tests. The passed devices are subjected to a sampling test (QA test) before the final shipment.

Figure 1:
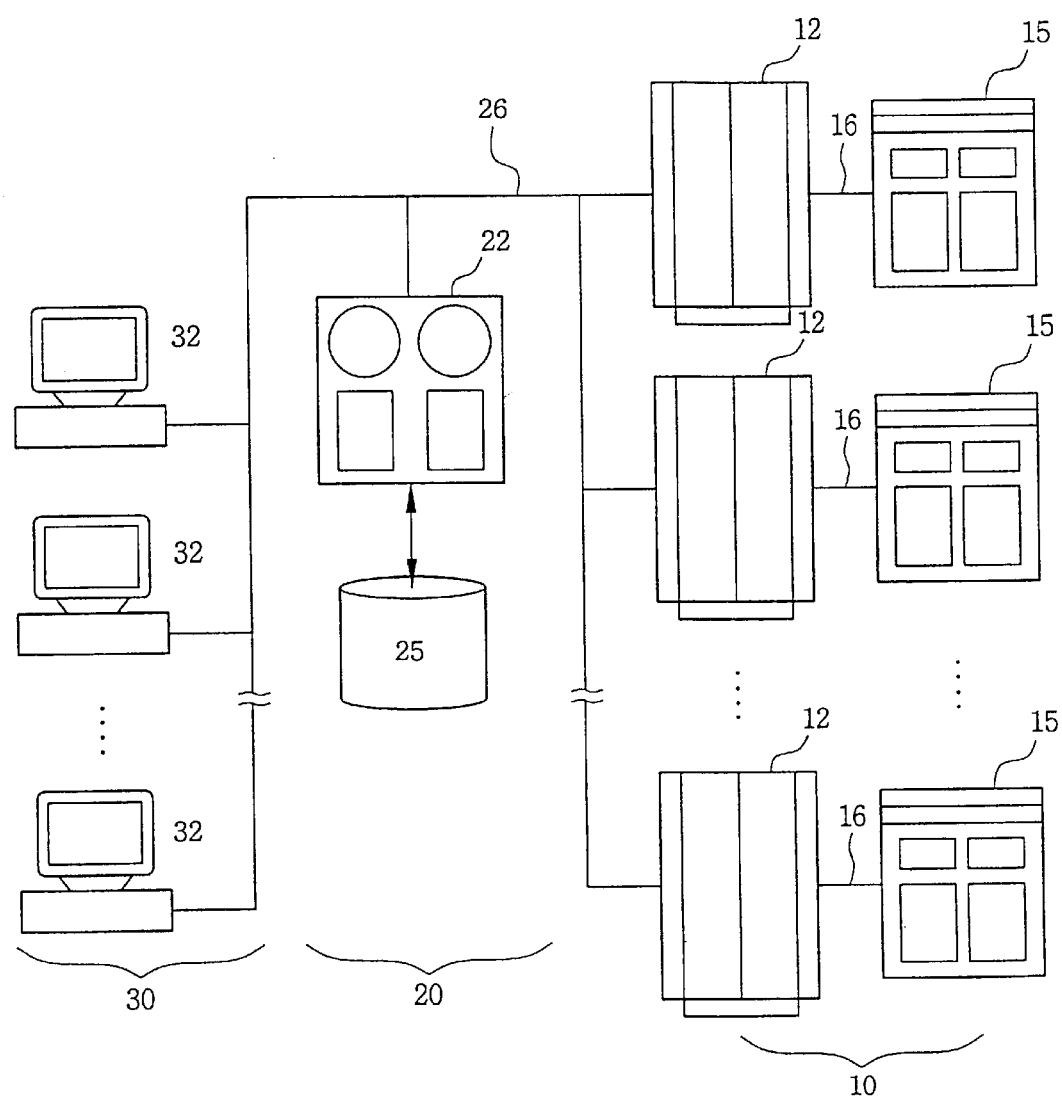
FIG. 1 is a block diagram showing the overall structure of a system for automatically analyzing and managing loss factors in a process for testing semiconductor integrated circuit devices.

FIG. 1 is a block diagram of a system for automatically analyzing and managing loss factors occurring in a test process according to the present invention.

In this embodiment, the system includes a testing system 10, a server system 20 and a terminal system 30. The testing system 10 includes a plurality of testers 12 and handlers 15. The tester 12 includes a digital processor (e.g., a CPU) and associated electronics, and is software driven. The tester 12 applies test signals to IC devices to be tested (not shown) and compares output signals from the IC devices with predetermined reference signals to provide test result signals. Typically, a test process is performed with IC devices socket-mounted on a test board. The test board is provided with circuits for sending and receiving electrical signals to and from the IC devices. The tester 12 is, for example, available from Advantest Corporation or Ando Corporation, both in Japan.

The handler 15 conveys IC devices to be tested from a carrier tray to a test tray. Further, the handler 15 places each of the IC devices in the test tray into an electrical socket located on the operating surface of the test board and electrically interconnects the tester 12 and the loaded IC devices.

The tester 12, under the control of resident software routines, provides instruction signals to, and receives test data from, the test board circuits and thus determines the performance or quality of each IC device being tested. The tester 12 sends binning (i.e., assorting) instruction signals, via a data/command communication cable 16, to the handler 15. Based on the binning signals, the handler 15 sorts the tested IC devices and conveys them into an appropriate carrier tray (e.g., pass or fail tray). Though the system shown in FIG. 1 includes a separate handler, it is, of course, possible to use an integrated handler with the tester.

The throughput of the handler 15 is determined mainly by its mechanical conditions and commonly is described by the handler's "index time." The index time is determined by distances for moving trays and devices within the handler as well as by the speed and acceleration of the movement, the number of physical sort categories and the transmission rate of the electrical tester/handler interface. Another parameter, which will influence the throughput of the handler, is the actual test time for the devices. The actual test time can be represented by the operation time of the CPU of a tester.

The server system 20 includes a server computer 22 for calculating loss factors and a database 25. The server computer 22 performs an overall management and processing of time data generated from the test system 10 consisting of a pair of a tester 12 and a handler 15. Generated time data and loss data calculated on the basis of the time data are stored into the database 25, which is under control of the server computer 20. The stored data will be explained in detail below.

The terminal system 30 comprises a plurality of computer terminals 32. The computer terminals 32 analyze loss factor data and, based on the analyzed data, provide output data through user interfaces such as standard time data viewers, loss factor reporters, index time analyzers, etc.

The test system 10, server computer 22 and terminal system 30 are connected to a network 26, which may be, for example an Ethernet.

Figure 2:
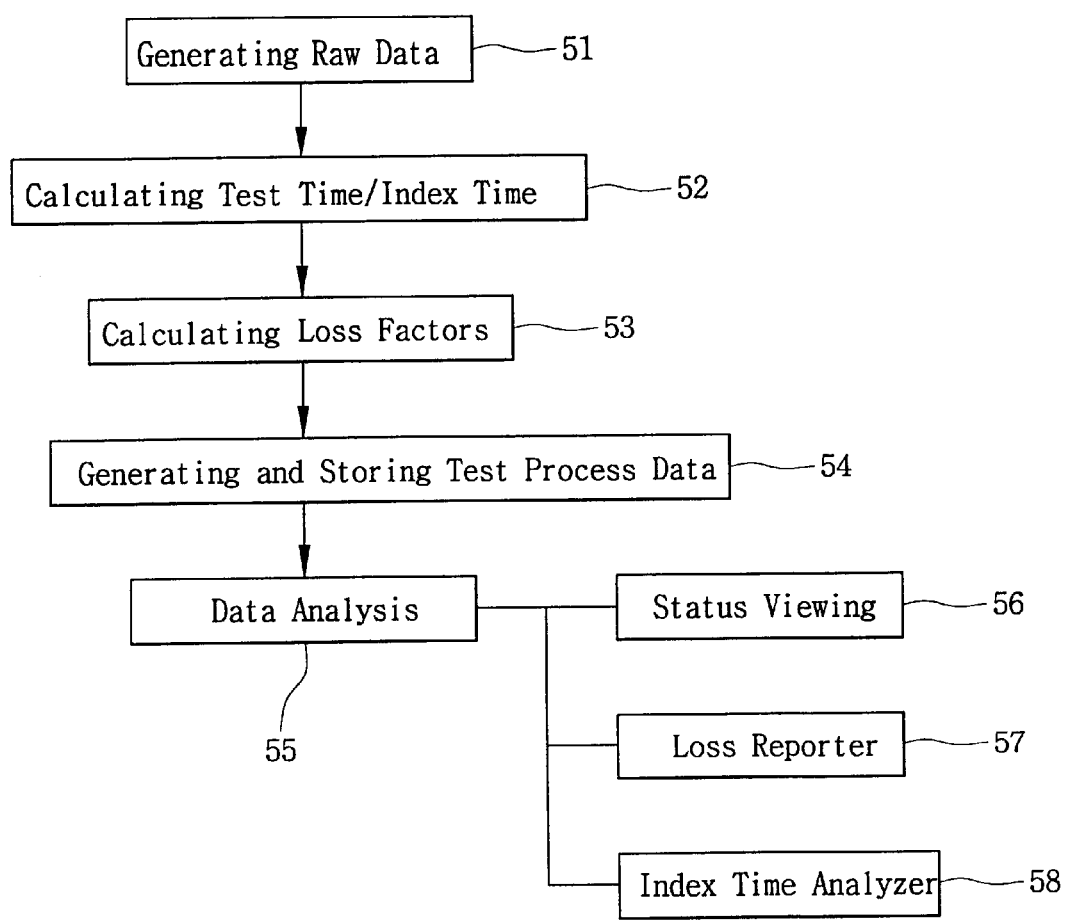
FIG. 2 is a flow chart showing a method of automatically analyzing and managing loss factors in a test process of semiconductor integrated circuit devices.

FIG. 2 shows overall sequences for automatically analyzing and managing loss factors occurring in a test process according to the present invention.

In the present invention, time data for the whole process from the beginning of operation of the test system to the end is generated. The time data can be used as raw data for analyzing loss factors occurring during the test process and should be reflected in real-time to the test process.

Referring to FIG. 2, raw data is generated in real-time as the test process progresses (step 51). On the basis of the raw data, test time data and index time data are calculated (step 52), and loss factors are calculated in the form of time-loss data (step 53). The test process is performed by lots each of which contains a predetermined number of identical semiconductor IC devices. In order to control a mass test process for many test systems applied to different lots and different devices, the raw data, test time data and index time data are generated and calculated for each test cycle of each lot.

Based on time data generated in steps 51, 52 and 53, test process data are generated and stored according to the sequence of the test lot (step 54). The test process data means integrally processed data for each of the plurality of lots, each of the semiconductor IC devices under test, and each of the test systems. Loss factors in a test process are managed by providing user interfaces according to the present invention which can analyze loss data (step 55) and provide status viewer (step 56), loss reporter (step 57) and index time analyzer (step 58) functions.

Figure 3:
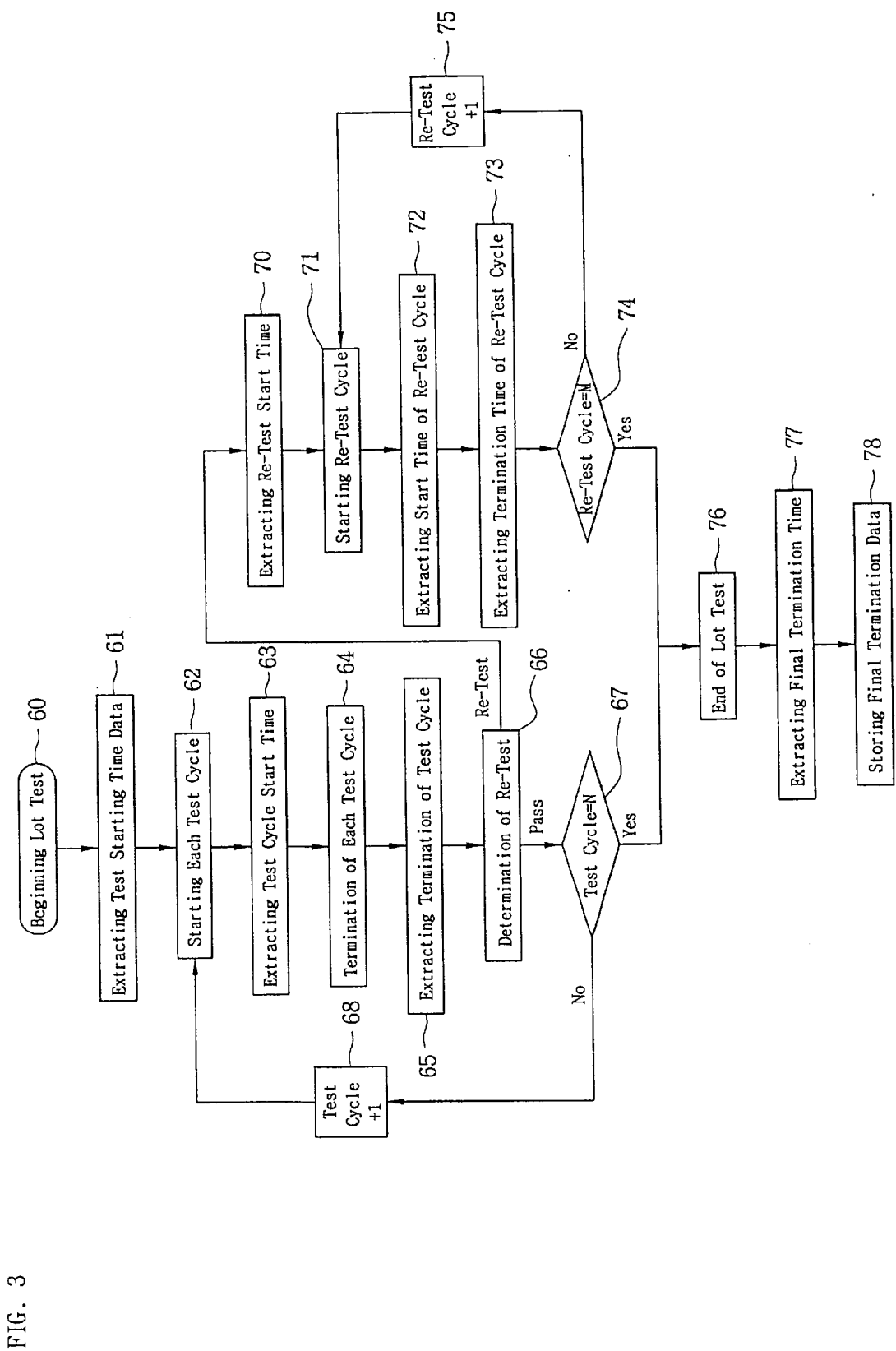
FIG. 3 is a flow chart of a raw data generating process.

FIG. 3 is a flow chart of a raw data generating process. A plurality of semiconductor IC chips tested as a lot are determined to pass or fail according to test results. When a lot test begins by starting a test program (step 60), the start time data of a tester is extracted (step 61). The test program is a program described by a test description language (also referred to as "TDL"). The test description language is structured by a hardware description language such as HDL or VHDL. The test program has the form of source code. Operators or test engineers provide necessary test parameters in the test program to define the test operation in the hardware of the semiconductor test system. The test program controls the operation of the tester and is described with test sequence and binning processes.

When each test cycle starts (step 62), the start time data of a test cycle is extracted (step 63). Test cycle start time data can be generated as raw data by e.g., extracting a start time of each test cycle from a test program. When each cycle ends (step 64), termination time for each test cycle is extracted (step 65), which can be produced by e.g., modifying the test program. Each test cycle can be identified by the test program. For instance, in the case of memory IC devices, DC, AC and functional tests constitute a single test cycle. When each test cycle ends, test results are confirmed to determine if a re-test should be performed (step 66).

If DUTs pass the determination step 66, it is determined whether the number of test cycles equals to a predetermined number 'N' (step 67), and if so the sequence goes to the next test cycle (step 68), otherwise the sequence returns to the step 62 to continue the current test process. The steps 63, 64, 65 and 66 are repeated 'N' times so long as the DUTs pass the determination step 66. The number 'N' is a positive integer and means the number of test cycles performed for the corresponding lot. This number is designated by the test program and may vary depending on the type of IC devices to be tested, the testers to be used and testing items.

When DUTs can not pass the step 66 and the sequence goes to the re-test step, the start time of the re-test is extracted (step 70), and of the re-test cycles begin (step 71). Repetition of extracting re-test cycle start time (step 72), extracting re-test termination time (step 73), determination of the number of re-test cycles 'M' (step 74) and increasing the number of re-test cycle (step 75) is similar to the process explained above for the first test procedure. The number 'M' is designated and determined by similar manner as the number 'N'.

If the condition 'test cycle=N' and/or 're-test cycle=M' are met, the sequence proceeds to the lot test termination step 76 and extracts and stores the termination time (steps 77 and 78).

The raw data generation can be made by modifying existing test programs in consideration of the operating system loaded on the testers. For example, for a semiconductor memory device testing system available from Advantest, test programs can be modified to include the following subroutines for generating raw data. The following subroutines can be implemented by ATL (Advanced Test Language) programming language.

```
GENERAL[5] INTIM1 = 0
STRING ATIM(6) = "00"
STRING STTM1(20) = "00"
STRING ENTER(1) =?<#0A>?
    READ TIMER TO INTIM1 /* CPU TIME READ */
    ATIM = ASCII(INTIM1)
    STTM1 = GDAY(1) /* CYCLE END TIME READ */
    SEARCH ASC CPUTIM : WTCPU1
    CLEAR! 9
    APPEND! 9 W ASC CPUTIM
    WRITE! 9 ENTER, ATIM, " ", STTM1
    CLOSE! 9
/* If CPUTIM.ASC file exists, append one cycle, and if not, create new file */
APPD2:
    SEARCH ASC CPUTIM2 : WTCPU2
    CLEAR! 9
```

```
        APPEND! 9 W ASC CPUTIM2
        WRITE! 9 W ASC CPUTIM2
        CLOSE! 9
        GOTO SDISP
    WTCPU1:
        CLEAR! 9
        OPEN! 9 W ASC CPUTIM
        WRITE! 9 ENTER, ATIM, " ", STTIM1
        CLOSE! 9
        GOTO APPD2
    WTCPU2:
        CLEAR! 9
        OPEN! 9 W ASC CPUTIM2
        WRITE! 9 ENTER, ATIM, " ", STTM1
        CLOSE! 9
    SDISP:
```

Figure 4:
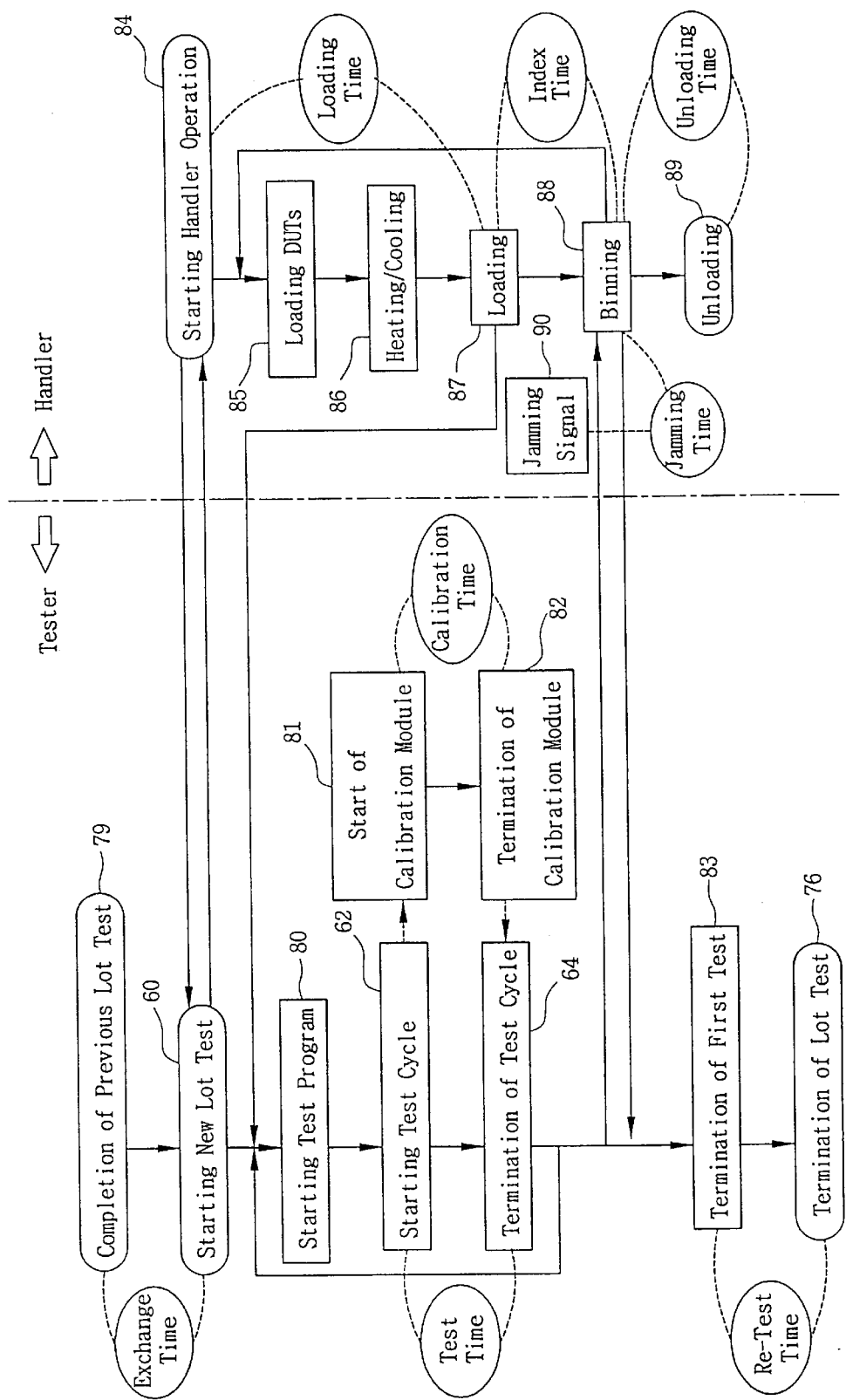
FIG. 4 is a flow chart of a test process in terms of operations of a tester and a handler.

FIG. 4 is a flow chart of a test process in terms of the operations of a tester and a handler. For the steps corresponding to those of FIG. 3, the same reference numerals are used.

When a lot test for a prior sequence is completed (step 79), the lot is changed and a new lot test is started for the new lot (step 60). Accordingly, the time between step 79 and step 60 is called the lot exchanging time. The starting of a lot test corresponds to the handler's starting step 84. The major purpose of the handling system is to move the devices under test from the carrier tray into the test tray (step 85), and to carry the DUTs to a heating/cooling chamber to control the temperature of the DUTs for the hot or cool test (step 86). Generally, the heating raises the temperature of the DUTs to about 83° C., while in the cool test the temperature of the DUTs is set to be −5° C. The time for heating or cooling the devices are referred to as 'soaking time.' The DUTs heated or cooled are loaded to a test head where the test system and the DUTs are electrically interconnected.

After loading, a loading completion signal is transmitted to the tester which starts a test program (step 80) to begin a test cycle (step 62). All of the testing items are applied to DUTs and the current test cycle is completed (step 64). During the test cycle, a calibrating module operates, if necessary, and starting and ending times of the module are extracted (step 81).

The operation of the calibrating module means the running of a calibration program. For instance, when the DUTs are changed, the temperature of the tester deviates from a standard range, a timing of a test program is changed or when global parameters of the test program are varied, the calibration program may be executed.

A time between the test cycle start step 62 and the test cycle completion step 64 is extracted as test time data. The calibration time data can be obtained by the duration between the calibration module start step 81 and the calibration module termination step 82.

When the test cycle terminates, depending on the number of test cycles performed, a new test cycle begins, or the sequence goes to the first test termination step 83. The time between the first test termination step 83 and the lot test termination step 76 is generated as re-test time data.

On the other hand, when the test cycle terminates, a termination signal is sent to the handler that physically sorts the IC devices tested into BIN categories according to their test results (step 88). A time between the DUTs loading step 87 and BIN sorting step 88 is stored as an indexing time data. When the load test ends, the handler unloads the IC devices sorted into the BIN categories to the tray (step 89). During the test, jamming time data, during which the testing equipment is temporarily troubled, is extracted. The jamming time refers to a temporal or transient failure of the equipment, which can be repaired by simple treatment.

FIG. 5 illustrates a process for extracting time data. This time data extracting process is logic for calculating time data by itemizing the procedures of testing a lot in a single test system.

In FIG. 5, the loading time data is calculated from the time when a handler starts its operation to the time when the first test cycle starts. The calibration time means a sum of time values obtained by certain test time values which are greater by a constant value C1 than an average test time and subtracted by the average test time. As explained before, the theoretical value of the calibration time is an operation time of a calibration module (i.e., the difference between the start and ending times of the calibrating program). However, when the calibrating value can not produce the start and ending times, an approximate value to the calibration time can be calculated by first obtaining larger operation times by a predetermined value than an average CPU operation time (which is defined by the difference between the ending and start times of a test cycle) and then subtracting the average time from the obtained larger values. Here, the constant C1 is obtained empirically or statistically and '2' in this embodiment.

The jamming time data is selected from indexing times which are equal to or greater than a constant C2 and equal to or smaller than a constant C3. In an embodiment, the constant C2 is sixty (60) seconds and the constant C3 is five (5) minutes. These values are determined empirically or statistically. Indexing time greater than C3, e.g., five (5) minutes may be classified and stored as a failure time data. In this embodiment, the failure time refers to long-term failure which can not be repaired by simple treatment and occurs by mechanical problem of a tester or a handler. The jamming time data may be caused, for example, when the IC devices during transfer by the handler are dropped on the floor or the IC devices are caught within the equipment. The long-term failure may occur, e.g., either when the equipment does not work properly because of the end of the lifespan of components, or when operators handle the equipment incorrectly.

The re-test time data is generated between the termination time of a test cycle and the start time of a re-test cycle. The unloading time data is the time when the lot test terminates after the final test cycle ends. The exchange time data is obtained by the time when the current lot starts after the previous lot test ends. The socket-off time data is a converted time value of a loss resulting when sockets in a test board of a test head fail during a parallel test. For example, supposing that sixty-four (64) sockets are provided in a single test board and it takes sixty-four (64) minutes for testing one test board, then testing of one IC device under test takes one (1) minute. If six (6) of the sixty-four (64) sockets are socket-off-failed, the test will be done for fifty-eight (58) sockets. However, even in this case, the test duration is unchanged and takes sixty-four (64) minutes. Accordingly, the test time for one IC device under test becomes longer to be one (1) minute and six (6) seconds. This excess of six (6) seconds is a kind of loss.

The loss factor data explained before including loading time data, calibration time data, jamming time data, failure time data, re-test time data, unloading time data, exchange time data and socket off time data constitutes test process loss data. However, these time data are not restricted to those explained above, and those who have ordinary skill in the art can easily understand that the loss time data varies depending on the test system and IC devices to be tested.

The test time per cycle data is generated by summation of CPU operation time of a tester in each test cycle, and index time data is produced by subtracting the termination time of (n) cycle from the start time of (n+1) cycle.

Figure 6:
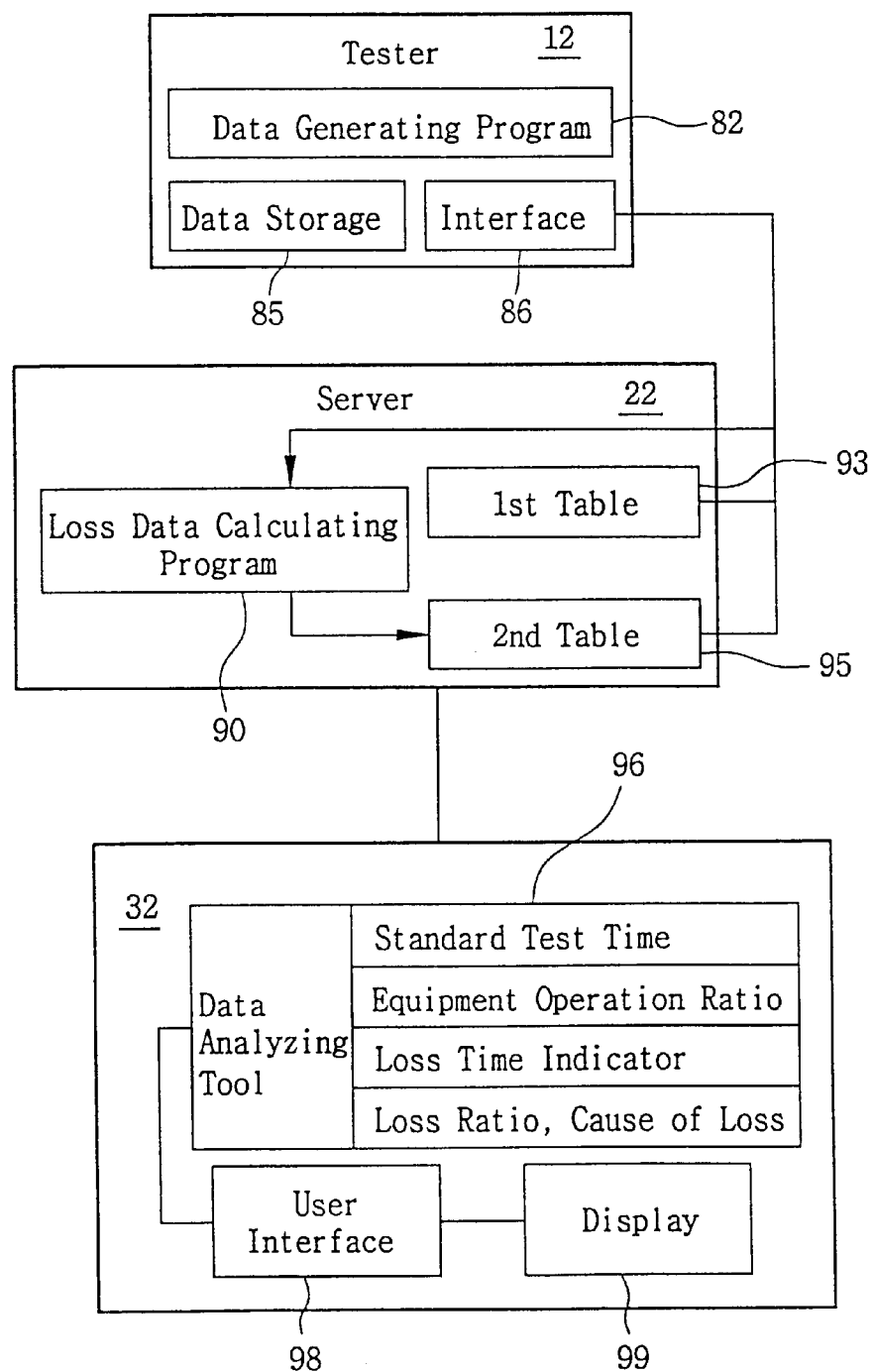
FIG. 6 is a schematic block diagram of a system for automatically analyzing and managing loss factors in a test process of semiconductor integrated circuit devices.

FIG. 6 is a block diagram of a system for automatically analyzing and managing loss factors according to one embodiment of the present invention.

A tester 12 comprises a data generating program 82, a data storage 85 and an interface 86. The data generating program 82: produces raw data; calculates, from the raw data, average test time and calibration time and index time data for each test cycle; and stores, in the form of a file, the calculated data into a data storage 85. The tester 12 transfers the stored data file to a server 22 through the interface 86 and a network (e.g., '26' of FIG. 1).

The server 22 includes a loss data calculating program 90 and first and second tables 93 and 95. Among data from the tester 12, average test time data and average index time data are stored into the first table 93, while index time data for each test cycle is stored into the second table 95. When data are input into the second table 95, the loss data calculating program 90 runs and calculates the loss factor data as described before. The calculated data is re-stored into the second table 95 and then updates the loss time data. A database (e.g., '25' of FIG. 1) may include the first and second tables 93 and 95.

A terminal computer 32 includes a data analyzing tool 96, an user interface 98 and a display 99. The tool 96 analyzes a standard test time, equipment operation ratio, loss time indicator, loss ratio and the cause of loss and displays the result through the user interface 98 and the display 99. The present invention is suitable for a production-oriented testing scheme which is designed for maximum throughput, i.e., for a maximum number of IC devices to be tested in a given time frame, because various data are analyzed based on an increased number of testers and IC devices by the data analyzing tool 96 and integrated and complete management of the test data is made possible.

Figure 7:
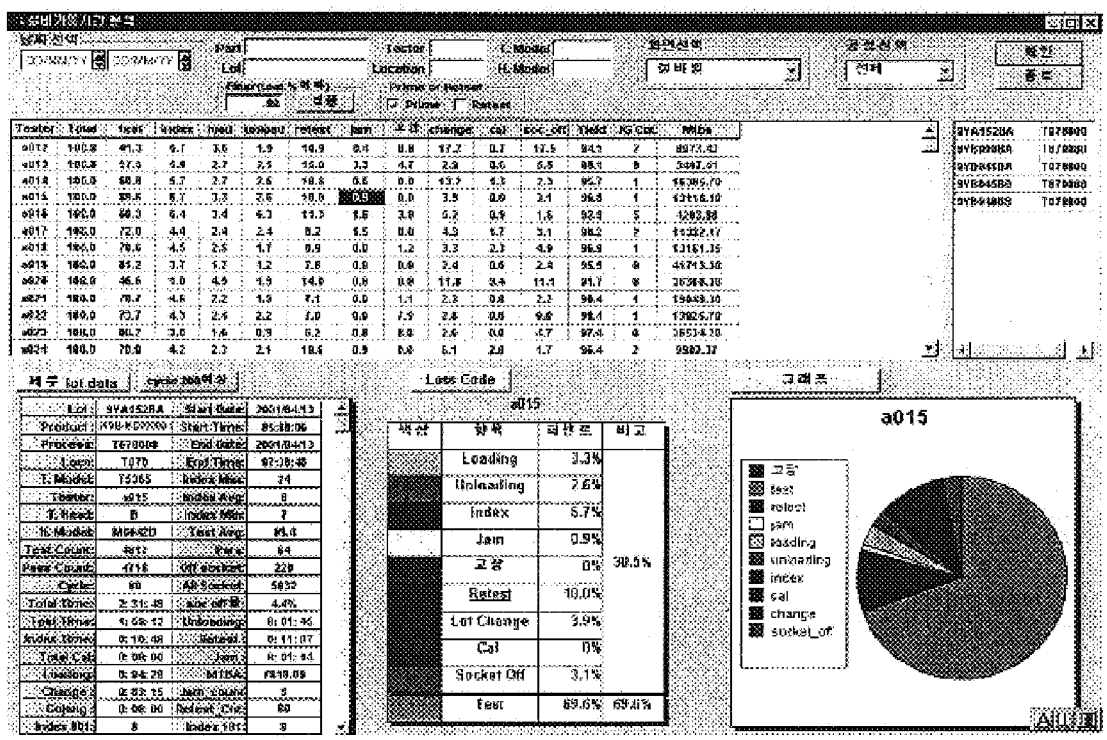
FIG. 7 shows an exemplary user interface suitable for use in analyzing and managing loss factors in a test process of semiconductor integrated circuit devices.

FIG. 7 shows an exemplary user interface suitable for use in analyzing and managing loss factors in IC test process.

The user interface shown in FIG. 7 is for analyzing equipment operation time, which can be displayed either based on testers and handlers or based on products, date, processes, lot sizes and so on. Users can reference time data, various loss time, achievement ratio, socket-off ratio and yield. Further, equipment operation hours either to the whole test process or to the specific testing step can be referenced. When a filtering function is employed, abnormal equipment having an extremely low achievement ratio can be easily and quickly detected and, therefore, the cause of the problem can be analyzed easily and quickly as such.

In FIG. 7, loss codes and a graphical diagram represent each loss factor as a percentage and identify each by its own color. Therefore, it is easy for users to detect a main cause of the loss. For example, time loss in 're-testing' amounts to 10.0% of the whole loss factors which includes 69.6% of testing time, when lot '9YA152BA' is tested.

Figure 8:
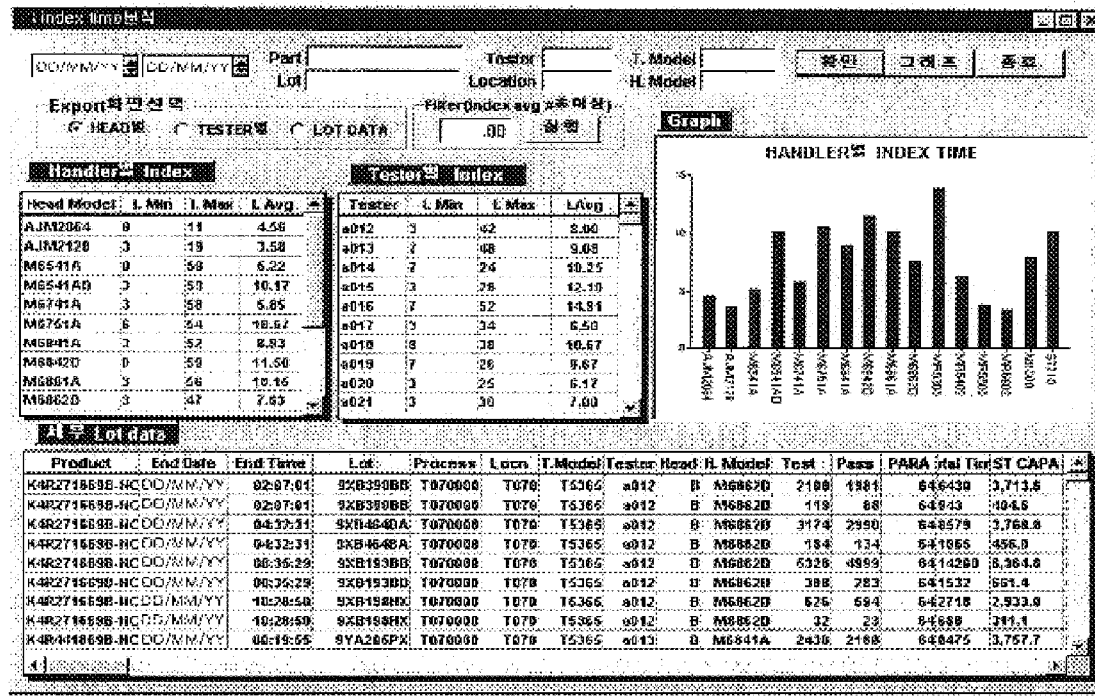
FIG. 8 shows another exemplary user interface suitable for use in analyzing and managing loss factors in a test process of semiconductor integrated circuit devices.

FIG. 8 is an exemplary user interface showing an index time analyzing screen.

The analysis of index time can be done based on handlers or testers. Users can reference detailed data for each test lot. The index time is displayed by minimum, maximum and average values which may be compared and analyzed. In this embodiment, since the average index time for each of a number of handlers are represented by a bar graph, the difference between the index time of the various to handlers can be distinguished at a glance. When users click and select a specific handler, testers using such a handler are listed so that the variation of the index time can be viewed according to each of the testers. Further, detailed lot data produced from each tester and handler are displayed by clicking and choosing a specific handler or tester.

FIG. 9 is an exemplary user interface showing a screen for analyzing standard time. The standard time analysis screen help users analyze and reference test time, index time and time per device based on products, versions, testers and handlers. In the selection of test time, users can choose one of two which includes or omits the calibration time. Even when the users do not know the exact product IC, users can reference wanted data by selecting a product type (e.g., 64M DRAM, 128M DRAM), version, and configuration (e.g., X4, X8). For example, when 16-parallel testing is performed by using a T5365 tester and MR5500 handler, the standard test time is thirty-five (35) seconds and the standard index time is two (2) seconds.

In the drawings and specification, there have been disclosed typical preferred embodiments of this invention and, although specific terms are employed, they are used in a generic and descriptive sense only and not for purposes of limitation, the scope of the present invention being set forth in the following claims.

What is claimed:

1. A system for automatically analyzing and managing loss factors occurring in a test process in which a plurality of semiconductor IC devices are tested as a lot with a number of testers, said lot containing a predetermined number of identical IC devices, and the lot test process being performed sequentially according to a plurality of test cycles, said system comprising:

a means for verifying test results for each of said test cycles and for determining whether a re-test is to be performed;

an IC device loading/unloading means for loading IC devices to be tested and contained in the lot to a test head and for unloading the tested IC devices from the test head by sorting the tested IC devices according to the test results;

a raw data generating means for generating raw data on the basis of time data occurring when the test process is performed;

a data calculating means for calculating testing time data, index time data based on the raw data, and loss time data;

a data storage means for storing the raw data and the calculated data; and a data analyzing and outputting means for analyzing the raw data and the calculated data according to the lots, the plurality of testers and the IC device loading/unloading means and for outputting the analyzed output through a user interface.

2. The system of claim 1, wherein each of said plurality of testers comprises a central processor operated according to instructions of a test program, and the generation of the raw data is output data of the test program.

3. The system of claim 1, wherein each of said plurality of testers comprises a central processor operated according to instructions of a test program, said testing time data corresponds to operation time of the central processor for each of test cycles.

4. The system of claim 1, wherein said index time data is obtained by the difference between a start time of an (n+1)-th test cycle and a termination time of an n-th test cycle.

5. The system of claim 4, wherein said index time data corresponds to an index time of said IC device loading/unloading means.

6. The system of claim 1, wherein said data storage means comprises a first table for storing test time data and index time data for each lot, and a second table for storing testing time data and index time data for each test cycle of each lot.

7. The system of claim 6, wherein the second table is continuously updated according to an increase of the number of test cycle.

8. The system of claim 1, wherein the loss time data includes loading time data, jamming time data, re-test time data, unloading time data and exchange time data.

9. The system of claim 8, wherein said loading time data is obtained by a difference between a beginning of operation of said IC device loading/unloading means and a start time of a first test cycle.

10. The system of claim 8, wherein said jamming time data is calculated by an index time which is greater than a first constant and less than a second constant, where the first and second constants are determined empirically.

11. The system of claim 8, wherein said re-test time data is obtained by a indifference between a start time of each re-test cycle and a termination time of each test cycle.

12. The system of claim 8, wherein said unloading time data is obtained by the difference between a termination time of final test cycle among the plurality of test cycles for each lot and a termination time of test for the lot.

13. The system of claim 8, wherein the exchange time data is obtained for each test cycle by the difference between a termination time of an (n−1)-th test cycle and a start time of an n-th test cycle.

14. The system of claim 8, wherein the loss time data further comprises calibration time data which corresponds to a sum of time values obtained by certain test time values greater by a third constant value than an average test time and subtracted by the average test time.

15. The system of claim 8, wherein the loss time data further comprises failure time data which is obtained by an index time greater than a fourth constant.

16. The system of claim 8, wherein the loss time data further comprises socket-off time data which is a converted time value of a loss occurring when sockets in a test board of a test head fail during a parallel test.

17. The system of claim 1, wherein said user interface provides a screen interface capable of displaying an equipment operation time based on the testers, handlers, IC devices to be tested, date, processes and lot sizes, and referencing the testing time data, the loss time data, an achievement ratio, a socket-off ratio, a yield and equipment operation time data for the test process.

18. The system of claim 1, wherein the user interface provides a screen interface for displaying minimum, maximum and average values of the index time data for each test lot and for indicating variations of the index time data according to the handlers.

19. A method for automatically analyzing and managing loss factors occurring in a test process in which a plurality of semiconductor IC devices are tested as a lot with a number of testers, said lot containing a predetermined number of identical IC devices, and the lot test process being performed sequentially according to a plurality of test cycles, said method comprising:

generating raw data for each of the plurality of test cycles in real-time according to progress of the test process;

generating test time data and index time data for each test cycle based on the generated raw data;

calculating loss time data based on the raw data, test time data and index time data;

generating and storing test process data based on data obtained from the step of calculating loss time data; and analyzing the test process data and outputting an analyzed result to a user interface.

20. The method of claim 19, wherein the step of generating raw data comprises:

extracting start time data of a tester;

extracting start time and termination time of a test cycle;

determining if a re-test is required by confirming a test result when a test cycle terminates;

determining if the test process continues or returns to the step of extracting start time data of a tester based on a number of test cycles performed;

starting the re-test when the re-test is determined to be required; and extracting final termination time data when a final test cycle ends.

21. The method of claim 20, wherein the plurality of time data obtained by steps of extracting start time data of a tester and extracting start time and termination time of a test cycle are generated as output data of a test program for controlling an operation of the testers.

22. The method of claim 19, wherein said step for calculating loss time data produces loading time data, jamming time data, re-test time data, unloading time data and exchange time data.

23. The method of claim 19, wherein said step for calculating loss time data produces calibration time data, failure time data and socket-off time data.

24. A system for automatically analyzing and managing loss factors occurring in a test process in which a plurality of semiconductor IC devices are tested as a lot with a number of testers, said lot containing a predetermined number of identical IC devices, and the lot test process being performed sequentially according to a plurality of test cycles, said system comprising:

a plurality of test systems each including a plurality of testers operated by a dedicated test program and IC devices loading/unloading means for loading IC devices to be tested into the tester and for unloading and sorting the tested IC devices depending on test results;

a server system including data storage means for integrally manipulating time data generated by the test systems according to the plurality of lots and test cycles and for storing the manipulated time data; and terminal systems electrically interconnected to the server system and communicating with operators with a user interface, wherein at least one of said plurality of testers and said server system comprise, raw data generation means for generating raw data based on the time data occurring during the test process, and data calculating means for calculating test time data, index time data and loss time data based on the raw data.

25. The system of claim 24, wherein each of said plurality of testers comprises a central processor operated according to instructions of a test program, and the generation of the raw data is output data of the test program.

26. The system of claim 24, wherein each of said plurality of testers comprises a central processor operated according to instructions of a test program, said test time data corresponds to operation time of the central processor for each of test cycles.

27. The system of claim 24, wherein said index time data is obtained by the difference between a start time of an (n+1)-th test cycle and a termination time of an n-th test cycle.

28. The system of claim 27, wherein said index time data corresponds to an index time of said IC device loading/unloading means.

29. The system of claim 24, wherein said data storage means comprises a first table for storing test time data and index time data for each lot, and a second table for storing test time data and index time data for each test cycle of each lot.

30. The system of claim 29, wherein the second table is continuously updated according to an increase of the number of test cycle.

31. The system of claim 24, wherein the loss time data includes loading time data, jamming time data, re-test time data, unloading time data and exchange time data.

32. The system of claim 31, wherein said jamming time data is calculated by an index time which is greater than a first constant and less than a second constant, wherein the first and second constants are determined empirically.

33. The system of claim 31, wherein said re-test time data is obtained by a difference between a start time of each re-test cycle and a termination time of each test cycle.

34. The system of claim 31, wherein said unloading time data is obtained by a difference between a termination time of a final test cycle among the plurality of test cycles for each lot and a termination time of testing for the lot.

35. The system of claim 31, wherein the exchange time data is obtained by the difference between a termination time of an (n−1)-th test cycle for each test cycle and a start time of an n-th test cycle.

36. The system of claim 31, wherein the loss time data further comprises calibration time data which corresponds to a sum of time values obtained by certain test time values greater by a third constant value than an average test time and subtracted by the average test time.

37. The system of claim 31, wherein the loss time data further comprises failure time data which is obtained by an index time greater than a fourth constant.

38. The system of claim 31, wherein the loss time data further comprises socket-off time data which is a converted time value of a loss occurring when sockets in a test board of a test head fail during a parallel test.

39. The system of claim 24, wherein said loading time data is obtained by a difference between a beginning of operation of said IC device loading/unloading means and a start time of a first test cycle.

40. The system of claim 24, wherein said user interface provides a screen interface capable of displaying an equipment operation time based on the testers, handlers, IC devices to be tested, date, processes and lot sizes, and referencing the test time data, the time loss data, an achievement ratio, a socket-off ratio, a yield and equipment operation time data for the test process.

41. The system of claim 24, wherein the user interface provides a screen interface for displaying minimum, maximum and average values of the index time data for each test lot and for indicating variations of index time data according to the handlers.

* * * * *